United States Patent [19]

Chatfield et al.

[11] Patent Number: 5,543,176
[45] Date of Patent: Aug. 6, 1996

[54] CVD OF AL$_2$O$_3$ LAYERS ON CUTTING INSERTS

[75] Inventors: Christopher G. Chatfield, Tumba; Jan N. Lindström, Hägersten; Mats E. K. Sjöstrand, Kista; Ingrid K. M. Collin, Enskede, all of Sweden

[73] Assignee: Sandvik AB, Sandviken, Sweden

[21] Appl. No.: 128,741

[22] Filed: Sep. 30, 1993

Related U.S. Application Data

[62] Division of Ser. No. 717,079, Jun. 18, 1991, abandoned, which is a continuation of Ser. No. 539,567, Jun. 15, 1990, Pat. No. 5,071,696.

[30] Foreign Application Priority Data

Jun. 16, 1989 [SE] Sweden .................. 8902179

[51] Int. Cl.$^6$ .................. C23C 16/00; B32B 9/00
[52] U.S. Cl. .................. 427/255.3; 427/255.2; 427/255.1; 427/248.1; 427/126.3; 51/307; 51/309; 428/698; 428/701; 428/702; 428/697
[58] Field of Search .................. 427/248.1, 255.1, 427/255.2, 255.3, 126.3; 428/698, 697, 701, 702; 51/307, 309

[56] References Cited

U.S. PATENT DOCUMENTS

| | | | |
|---|---|---|---|
| Re. 29,420 | 9/1977 | Lindstrom et al. | 428/336 |
| Re. 31,526 | 2/1984 | Smith et al. | 427/255.2 |
| Re. 32,111 | 4/1986 | Lambert et al. | 428/216 |
| 3,736,107 | 5/1973 | Hale | 29/182.7 |
| 3,836,392 | 9/1974 | Lux et al. . | |
| 3,837,894 | 9/1974 | Tucker, Jr. | 428/632 |
| 3,885,063 | 5/1975 | Schachner et al. | 427/255.3 |
| 3,917,473 | 10/1975 | Hale | 427/255 |
| 3,955,038 | 5/1976 | Lindstrom et al. | 428/457 |
| 3,977,061 | 8/1976 | Lindstrom et al. | 428/698 |
| 4,018,631 | 4/1977 | Hale | 148/31.5 |
| 4,035,541 | 7/1977 | Smith et al. | 428/217 |
| 4,169,913 | 10/1979 | Kobayashi et al. | 428/217 |
| 4,180,400 | 12/1979 | Smith et al. | 428/469 |
| 4,239,536 | 12/1980 | Yamamoto et al. | 75/238 |
| 4,268,569 | 5/1981 | Hale | 128/215 |
| 4,399,168 | 8/1983 | Kullander et al. | 428/698 |
| 4,463,062 | 7/1984 | Hale | 428/701 |
| 4,474,849 | 10/1984 | Fujimori | 428/332 |
| 4,619,866 | 10/1986 | Smith et al. | 428/336 |
| 4,714,660 | 12/1987 | Gates, Jr. | 428/472 |
| 4,749,630 | 6/1988 | Konig et al. | 428/698 |
| 4,984,940 | 1/1991 | Bryant et al. | 51/295 |

FOREIGN PATENT DOCUMENTS 0106817  4/1984  European Pat. Off. .

OTHER PUBLICATIONS

Jan Skogsmo et al, "Microstructural Observations on Alumina Coatings Produced By Chemical Vapour Deposition", Proceedings, vol. 3, 12th International Plansee Seminar May 5–12, 1989 pp. 129–142.

C. Chatfield, "Characterization of the Interfaces in Chemical Vapour Deposited Coatings on Cemented Carbides", RM & HM, Sep. 1990, pp. 1–7.

*Primary Examiner*—Roy V. King
*Attorney, Agent, or Firm*—Burns, Doane, Swecker & Mathis

[57] ABSTRACT

The present invention relates to a method for coating a cutting insert having at least one layer of a carbide, carbonitride, oxynitride, oxycarbide, oxycarbonitride or nitride of one metal selected form the groups IVB, VB or VIB of the Periodic Table, the method comprising subjecting the insert to chemical vapor deposition and coating the insert with an epitaxial kappa-$Al_2O_3$ layer by the hydrolysis reaction of $AlCl_3$, $H_2$ and $CO_2$, the hydrolysis reaction being carried out while maintaining the content of water vapor in the gas phase during nucleation of $Al_2O_3$ at less than 5 ppm.

19 Claims, 1 Drawing Sheet

CVD OF AL$_2$O$_3$ LAYERS ON CUTTING INSERTS

This application is a divisional of Application Ser. No. 07/717,079, filed Jun. 18, 1991, now abandoned, which is a continuation of Ser. No. 07/539,567 filed on Jun. 15, 1990, now U.S. Pat. No. 5,071,696.

BACKGROUND OF THE INVENTION

The present invention relates to a coated cutting insert for chipforming machining.

The Chemical Vapor Deposition (CVD) of alumina on cutting tools has been an industrial practice for more than 15 years. The wear properties of Al$_2$O$_3$ as well as of TiC and TiN have been discussed extensively in the literature.

The CVD technique has also been used to produce coatings of other metal oxides, carbides and nitrides with the metal selected from the transition metals of the groups IVB, VB and VIB of the Periodic Table, silicon, boron and aluminum. Many of these compounds have found practical applications as wear resistant or protective coatings, but few have received as much attention as TiC, TiN and Al$_2$O$_3$.

Initially, coated tools were intended for turning applications, but today tools designed for milling as well as drilling applications, are coated. Improvements of the bonding to the substrate (generally a cemented carbide) and between different coating materials have resulted in a plurality of coating combinations with double-, triple- and multi-layer structures.

The reaction mechanisms occurring during the CVD of Al$_2$O$_3$ have been analyzed, but little has been mentioned about the stability and microstructure of the deposited Al$_2$O$_3$ phases and how the formation of these phases depends on the deposition process.

Al$_2$O$_3$ crystallizes in several different phases of which the alpha-structure (corundum) is the thermodynamically stable phase at typical deposition temperatures. The metastable kappa-phase is the second most commonly occurring modification in CVD-Al$_2$O$_3$. Other infrequently occurring types are theta-, gamma- and delta-Al$_2$O$_3$.

In commercial tools, Al$_2$O$_3$ is always applied on TiC-coated cemented carbide (see, e.g., U.S. Pat. No. 3,837,896, now U.S. Pat. No. Re. 29,420) and therefore the interface reactions of the TiC-surface are of particular importance. The TiC-layer should also be understood to include those layers having the formula TiC$_x$N$_y$O$_z$ in which the C in TiC is completely or partly substituted by oxygen and/or nitrogen. In the system TiC$_x$N$_y$O$_x$ there is 100% miscibility. There can be one or more layers of this kind. Similar relationships also exist within other systems, e.g., Zr—C—N—O.

The purpose of the present invention has been to obtain such an Al$_2$O$_3$-layer with the correct crystallography, microstructure and morphology and under nucleation conditions such that the desired Al$_2$O$_3$-phases will be stabilized.

A typical surface structure of a CVD-Al$_2$O$_3$ coating contains coarse-grained islands of alpha-Al$_2$O$_3$, the first Al$_2$O$_3$ phase to nucleate, surrounded by much more fine-grained kappa-Al$_2$O$_3$ areas. When greater amounts of such alpha-Al$_2$O$_3$ exist the individual islands join together. The ratio of coarse-grained/fine-grained areas can vary over a broad range.

Also, the alpha/kappa ratio measured by X-ray diffraction will vary over a wide range. A higher ratio is obtained at long coating times and after further heat treatment. After about 3 hours heat treatment at 1000° C., essentially all the thermodynamically metastable kappa-Al$_2$O$_3$ is transformed to stable alpha-Al$_2$O$_3$. It is important to note that the transformation kappa→alpha takes place without any great changes in surface morphology. The alpha-Al$_2$O$_3$ formed from kappa-Al$_2$O$_3$ is fine-grained.

The kinetics behind the phase transformation of metastable kappa-Al$_2$O$_3$ to stable alpha-Al$_2$O$_3$ is not clear. It should be noted, however, that only small rearrangements of the close-packed oxygen layers that are common to both structures, are needed to convert kappa- to alpha-Al$_2$O$_3$.

In U.S. Pat. No. 4,180,400 (now U.S. Pat. No. Re. 31,526) a method of making kappa-Al$_2$O$_3$ has been proposed being based essentially on the fact that an addition of TiCl$_4$ to the gas mixture results in kappa-Al$_2$O$_3$ formation. Any kappa-phase, formed under these conditions, does not have an epitaxial relationship with the layer below a thick Al$_2$O$_3$-layer, however. (A thick Al$_2$O$_3$-layer is more than 2 μm Al$_2$O$_3$).

The microstructure of an alpha-Al$_2$O$_3$ coating initially nucleated as alpha-Al$_2$O$_3$ is characterized by a grain size of about 0.5–5 μm, preferably 0.5–2 μm, and the presence of pores. Contrary to this, a kappa-Al$_2$O$_3$ coating is essentially pore-free and has a much smaller grain size of about 0.5–2 μm, preferably 0.05–1 μm, usually about 0.2–0.5 μm.

OBJECTS AND SUMMARY OF THE INVENTION

It is an object of the present invention to alleviate or substantially reduce the problems of the prior art.

It is also an object of the present invention to provide an alumina coating on a metal carbide, nitride, carbonitride, oxynitride, and oxycarbides having an improved adhesion.

It is a further object of the invention to provide a cutting tool having multiple coatings including at least one coating of alumina in contact with a metal carbide, nitride, carbonitride, oxynitride or oxycarbonitride having improved adhesion between the layers.

In one aspect of the present invention, there is provided a body coated with at least one layer of Al$_2$O$_3$ and at least one layer of a carbide, nitride, carbonitride, oxynitride or oxycarbonitride of a metal selected from the group consisting of metals in the Groups IVB, VB and VIB of the periodic table, B, Al and Si and mixtures thereof wherein the Al$_2$O$_3$ layer in contact with the said metal carbide, nitride, carbonitride or oxycarbonitride layer comprises epitaxial kappa-alumina or theta-alumina.

In another aspect of the present invention, there is provided a metal cutting insert comprising a cemented carbide substrate coated with at least one layer of TiC and at least one adjacent layer of alpha Al$_2$O$_3$, at least some of the alpha-Al$_2$O$_3$ having been formed by the transformation of epitaxial kappa- or theta-Al$_2$O$_3$.

In still another aspect of the present invention, there is provided a method for coating a body by chemical vapor deposition of Al$_2$O$_3$ by the hydrolysis reaction of AlCl$_3$, H$_2$ and water, the improvement which comprises maintaining the content of water vapor during nucleation of the Al$_2$O$_3$ at less than 5 ppm.

DETAILED DESCRIPTION OF THE PREFERRED EMBODIMENTS

Figure 1:
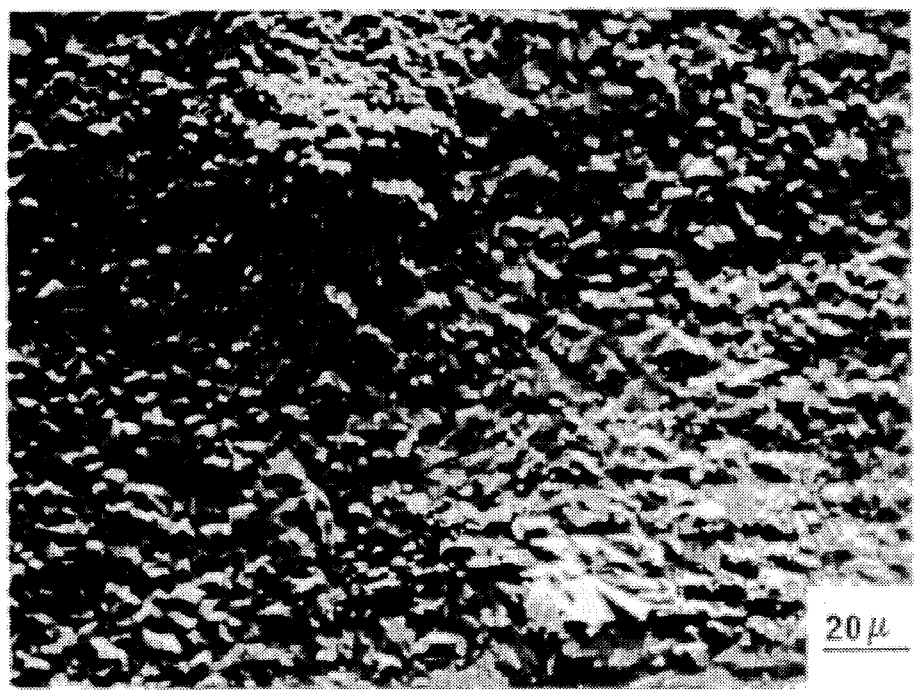
FIG. 1 shows an Al$_2$O$_3$-surface consisting of initially nucleated alpha- (coarse-grained) and kappa- (fine-grained) structure.

It has now been found that poor adhesion between the $Al_2O_3$-layer and the underlying TiC-layer is obtained if the $Al_2O_3$ in direct contact with the TiC-layer has the alpha-$Al_2O_3$ crystal structure at the time when it is nucleated. In such a case, considerable porosity exists between the two layers. If, on the other hand, kappa- or theta-$Al_2O_3$ is in direct contact with the TiC-layer, the transition is pore-free and good adhesion is obtained. In the latter case a direct lattice relationship exists between the orientations of the $Al_2O_3$ and the TiC-layers, i.e., the $Al_2O_3$-layer grows epitaxially. The following relationships exist between TiC/kappa-$Al_2O_3$:

($1\bar{1}1$) TiC//(0001) kappa-$Al_2O_3$

[110] TiC//[$1\bar{0}10$] kappa-$Al_2O_3$ and between TiC/theta-$Al_2O_3$:

(111) TiC//(310) theta-$Al_2O_3$

[$1\bar{1}0$] TiC//[001] theta-$Al_2O_3$

Both of these can be interpreted as indicating that close-packed atom planes in the $Al_2O_3$- and TiC-phases are in contact and thus the adhesion across the interface between $Al_2O_3$ and TiC will be maximized. Similar epitaxial relationships should also exist between $Al_2O_3$ and metal systems related with TiC, e.g., ZrC and for other carbides, carbonitrides, oxynitrides, oxycarbides, oxycarbonitrides and nitrides of metals in the groups IVB, VB and VIB of the Periodic Table and for B, Al and Si and should maximize adhesion between the phases on either side of the interface.

The process conditions governing the first nucleation event are thus of great importance. The oxidation state of the TiC-surface is decisive for the kind of nuclei which are to be formed. If the TiC-surface is (intentionally) oxidized only alpha-$Al_2O_3$ is formed. Simple calculations show that the presence of water in $H_2$ carrier gas has a dramatic effect on the oxidation state. Already at 5 ppm water in $H_2$ at 1000° C. and 560 mbar the TiC surface oxidizes to $Ti_2O_3$. At higher water contents (20–30 ppm) $Ti_3O_5$ is formed. It should be observed that the formation of titanium oxide ($Ti_2O_3$, $Ti_3O_5$) involves a volume increase of 25–30%. Also, other oxygen containing compounds than water in the feed-gas can cause oxidation.

The water gas concentration in the reactor during $Al_2O_3$ coating at typical conditions for good adhesion is very small and all water is used during the hydrolysis reaction with $AlCl_3$. For a typical reactor, the water content is 0.01–0.1 ppm. The water concentration varies, however, greatly during the nucleation event and can locally reach 1000–2000 ppm. It is thus possible to oxidize the TiC surface during the $Al_2O_3$ nucleation stage. Another contribution to the oxidation of the TiC-surface comes from the heterogeneous decomposition of $CO_2$, in which surface adsorbed monoatomic oxygen can oxidize the TiC-surface.

It is surprising that such low-oxidizing conditions would be necessary to obtain a well-adherent oxide coating ($Al_2O_3$). The prior art even recommends the use of oxidized surfaces to form well-adherent dense $Al_2O_3$-coatings (see, e.g., U.S. Pat. Nos. 3,736,107; 3,837,896; 4,018,631 or 4,608,098).

It has thus been found that no well-defined lattice-orientation relationship exists between TiC and alpha-$Al_2O_3$, which has been nucleated on TiC from gas phase. Instead, the TiC-$Al_2O_3$ does not take place on TiC but on a thin oxide film of e.g., $Ti_2O_3$, $Ti_3O_5$ or $TiO_2$ what thus makes the formation of an epitaxial relationship with the underlying TiC-surface impossible. However, because there is no trace of any intermediate layer of $Ti_2O_3$, $Ti_3O_5$ or $TiO_2$ in the final product it must be assumed that a transformation to TiO, TiCO or TiC has happened during the relatively extended coating period. The volume contraction (25–30%) which accompanies the phase transformation $Ti_3O_5$ or $Ti_2O_3$ to TiO would explain the observed interfacial porosity.

Contrary to this, kappa-$Al_2O_3$ or theta-$Al_2O_3$ is nucleated directly on non-oxidized or relatively weakly oxidized (up to highest $Ti_2O_3$) TiC-surfaces, which results in an epitaxial relationship between the TiC- and the $Al_2O_3$-layers and, as then, no reduction of $Ti_2O_3$ etc. to TiO occurs, thus in the absence of porosity.

The alpha-$Al_2O_3$ is, as mentioned, the stable structure and has a higher density than kappa-$Al_2O_3$. If, during the nucleation, kappa-$Al_2O_3$ is formed then the resulting layer will have a more fine-grained and uniform structure than, in particular, a mixture of kappa- and alpha-$Al_2O_3$. If only or almost only alpha-$Al_2O_3$ is obtained, it takes place in connection with the reduction of higher titanium oxides (e.g., $TiO_2$$Ti_3O_5$) and porosity will be formed.

FIG. 1 shows an $Al_2O_3$-surface consisting of initially nucleated alpha- (coarse-grained) and kappa- (fine-grained) structure. As may be seen, the majority of the $Al_2O_3$ is nucleated in the kappa form while the remainder is initially in the alpha form.

Figure 2:
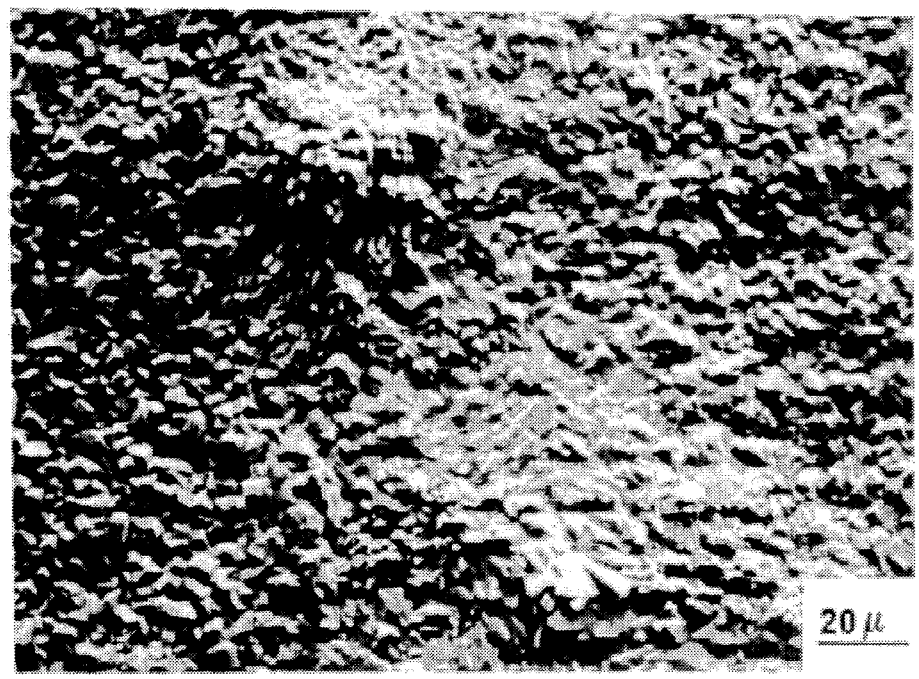
FIG. 2 shows the same microstructural feature, but after 4 hours heat treatment, by which a microstructure of alpha-$Al_2O_3$ of fine-grained type has been obtained by transformation of kappa-$Al_2O_3$ produced according to the invention, mixed with initially formed alpha-$Al_2O_3$.

FIG. 2 shows the same microstructural feature, but after 4 hours heat treatment, by which a microstructure of alpha-$Al_2O_3$ of fine-grained type has been obtained by transformation of kappa-$Al_2O_3$ produced according to the invention, mixed with initially formed alpha-$Al_2O_3$.

According to the invention there is thus now available a body such as, e.g., a cutting insert for chipforming machining with a substrate of cemented carbide as known in the art and as commercially available, coated with at least one layer of $Al_2O_3$ and one layer of TiC in which the $Al_2O_3$-layer is in epitaxial contact with an adjacent TiC-layer and comprises the form of kappa- or theta-$Al_2O_3$. In general, the coated body is treated, for example, by subsequent heat treatment, so that at least 90%, preferably at least 98%, of the initially nucleated kappa- or theta-$Al_2O_3$ is transformed to alpha-$Al_2O_3$. By this measure, a dense and wear resistant alpha-$Al_2O_3$ layer is obtained which is fine-grained and has a good bond to the underlying TIC-, TiN- or TiO-layer. The fine grain size and the good bond are caused by the excellent nucleation properties of the initially nucleated kappa-$Al_2O_3$-layer. In said respect, the invention can be described as alpha-$Al_2O_3$ with kappa-$Al_2O_3$-morphology. That is, the occurrence of alpha-$Al_2O_3$ can only be verified by X-ray diffraction or similar methods.

The invention also relates to a method for obtaining $Al_2O_3$-layers with good adherence to the substrate (including the TiC, TiN, etc. interlayer). By said method, the coating shall be performed so that oxidization of the surface of the TiC-layer is avoided at the transition to the $Al_2O_3$-coating process by keeping the water vapor concentration at the nucleation below 5 ppm, preferably below 0.5 ppm, most preferably from 0.01–0.1 ppm. In this context, it should be noted that the interlayer must have a thickness and such properties that metals (e.g., Co) catalyzing the $CO_2$ decomposition to oxygen and CO cannot penetrate the interlayer and cause excessive oxidation of the surface on which $Al_2O_3$ is to be nucleated. The coated body can then alternatively be heat treated for 0.3–10, preferably 1–4, hours, at a temperature of 900°–1100° C. preferably in a protective gas atmosphere as known to the skilled artisan.

By double layer is also meant known layers of current multitype inner as well as outer layers. Also, when, e.g., TiC or TiN is deposited on $Al_2O_3$ the invention can be applied.

The invention is additionally illustrated in connection with the following Examples which are to be considered as illustrative of the present invention. It should be understood, however, that the invention is not limited to the specific details of the Examples.

EXAMPLE 1

Cutting inserts were coated under the same conditions as in Example 1 in U.S. Pat. No. 3,837,896 by which a 3 μm thick layer was obtained by suitably sparse packing and hydrolysis reaction to $AlCl_3$, $H_2$ and $CO_2$. The water concentration was kept to such a low level before and during the $Al_2O_3$-nucleation that mainly kappa-$Al_2O_3$ was nucleated in contact with TiC, cutting insert A.

The cutting inserts were then tested with respect to edge line flaking with the results given below.

The flaking test was performed as a facing operation of a low carbon steel test piece with intermittent cuts obtained by preformed slits cut into the test piece. Since low carbon steels vary in composition and other properties the configuration of the slits and cutting data must be adjusted by performing preliminary tests enabling final best conditions to be obtained. The results of the cutting test is expressed as the ratio of flaking length of the edge line and the total edge line in the cutting operation.

| Test | % alpha-$Al_2O_3$ | flaking |
| --- | --- | --- |
| A | 15 | 70 (acc. to the inv.) |
| B | 90 | 90 (known techn.) |

Testing of the wear resistance showed that the variant B, in addition, had inferior face wear resistance and shorter life.

EXAMPLE 2

Cutting inserts coated under the same conditions as in Example 1 and in which the coating thus consisted essentially of about 3 μm kappa-$Al_2O_3$ were heat treated at 1020 C. in a hydrogen gas atmosphere and the kappa-phase was successively transformed to alpha-phase.

The inserts were then tested with respect to edge line flaking with results below:

| Test | Heat treatment time, h | % alpha-$Al_2O_3$ | flaking |
| --- | --- | --- | --- |
| C | 8 | 100 | 65 |
| D | 2 | 35 | 50 |

Testing of the wear resistance showed that the variant D had inferior face wear resistance and the shortest life of the inserts C and D.

EXAMPLE 3

Cutting inserts were coated in accordance with Example 1 in U.S. Pat. No. 3,837,896 at which 1 μm $Al_2O_3$-layer was obtained by a dense packing of inserts and supporting details. The coated inserts had a high carbon content so that about 6 μm thick TiC-layer was formed. Inserts were taken out from different parts of the coating charge. One group of inserts had kappa-$Al_2O_3$ in contact with the TiC-layer. These inserts showed in an intermittent turning test no tendency for the $Al_2O_3$-layers to "flake" from the TiC-layer. Another group of inserts with almost only alpha-$Al_2O_3$ in contact with TiC flaked to about 45% of the surface exposed to the chip.

The principles, preferred embodiments and modes of operation of the present invention have been described in the foregoing application. The invention which is intended to be protect herein should not, however, be construed as limited to the particular forms disclosed, as these are to be regarded as illustrative rather than restrictive. Variations and changes may be made by those skilled in the art without departing from the spirit of the present invention. Accordingly, the foregoing detailed description should be considered exemplary in nature and not limited to the scope and spirit of the invention as set forth in the appended claims.

What is claimed is:

1. A method of coating a body adapted for a cutting insert having at least one layer of a carbide, carbonitride, oxynitride, oxycarbide, oxycarbonitride or nitride of one metal selected from the groups IVB, VB, or VIB of the Periodic Table, the method comprising subjecting the body to chemical vapor deposition and coating the body with an epitaxial kappa-$Al_2O_3$ layer by the hydrolysis reaction of $AlCl_3$, $H_2$ and $CO_2$, the hydrolysis reaction being carried out while maintaining the content of water vapor in the as phase during nucleation of $Al_2O_3$ at less than 5 ppm.

2. The method of claim 1, wherein the water vapor during the nucleation is less than 0.5 ppm.

3. The method of claim 1, wherein after coating, the body is heat treated for 0.3–10 hours at 900°–1100° C. in a protective-gas atmosphere.

4. The method of claim 1, wherein the body includes a layer of titanium carbide and the $Al_2O_3$ layer is deposited in contact with the titanium carbide layer during the coating step.

5. The method of claim 4, wherein the body comprises a cemented carbide substrate coated with the titanium carbide layer.

6. The method of claim 4, wherein the following lattice orientation relationship exists between the kappa-$Al_2O_3$ and titanium carbide layers:

($1\bar{1}1$)TiC//(0001)kappa-$Al_2O_3$

[110] TiC//[$00\bar{1}1$] kappa-$Al_2O_3$.

7. The method of claim 1, wherein the body is a metal cutting insert.

8. The method of claim 4, wherein oxidation of the titanium carbide layer is prevented during the coating step.

9. The method of claim 1, further comprising heat treating the coated body and transforming the kappa-$Al_2O_3$ layer to an alpha-$Al_2O_3$ layer.

10. The method of claim 1, wherein the kappa-$Al_2O_3$ layer is essentially pore free.

11. The method of claim 1, wherein the body includes a layer of titanium carbonitride and the $Al_2O_3$ layer is deposited in contact with the titanium carbonitride layer during the coating step.

12. A method of coating a cutting insert having at least one layer of a carbide, carbonitride, oxynitride, oxycarbide, oxycarbonitride or nitride of one metal selected from the groups IVB, VB or VIB of the Periodic Table, the method comprising subjecting the insert to chemical vapor deposition and coating the insert with an epitaxial kappa-$Al_2O_3$ layer by the hydrolysis reaction of $AlCl_3$, $H_2$ and $CO_2$, the hydrolysis reaction being carried out while maintaining the content of water vapor in the gas phase during nucleation of $Al_2O_3$ at less than 5 ppm.

13. The method of claim 12, wherein the insert includes a layer of titanium carbide and the $Al_2O_3$ layer is deposited in contact with the titanium carbide layer during the coating step.

14. The method of claim 13, wherein oxidation of the titanium carbide layer is prevented during the coating step.

15. The method of claim 13, wherein the following lattice orientation relationship exists between the kappa-$Al_2O_3$ and titanium carbide layers:

($1\bar{1}1$) TiC//(0001) kappa-$Al_2O_3$

[110] TiC//[$0\bar{0}\bar{1}0$] kappa-$Al_2O_3$.

16. The method of claim 12, further comprising heat treating the insert and transforming the kappa-$Al_2O_3$ layer to an alpha-$Al_2O_3$ layer.

17. The method of claim 12, wherein the kappa-$Al_2O_3$ layer is essentially pore free.

18. The method of claim 12, wherein the insert includes a layer of titanium carbonitride and the $Al_2O_3$ layer is deposited in contact with the titanium carbonitride layer during the coating step.

19. The method of claim 12, wherein the water vapor content during the nucleation of $Al_2O_3$ is less than 0.5 ppm.

* * * * *